US012805032B2

(12) United States Patent
Miao et al.

(10) Patent No.: US 12,805,032 B2
(45) Date of Patent: Nov. 17, 2026

(54) TWO-DIMENSIONAL METAL/SEMICONDUCTOR/METAL DEVICE WITH NON-VOLATILE AND LINEARLY TUNABLE OPTICAL RESPONSIVITY BASED ON SULFUR VACANCY MIGRATION, AND PREPARATION METHOD THEREOF

(71) Applicant: SHANGHAI INSTITUTE OF TECHNICAL PHYSICS CAS, Shanghai (CN)

(72) Inventors: Jinshui Miao, Shanghai (CN); Tangxin Li, Shanghai (CN); Weida Hu, Shanghai (CN); Xiao Fu, Shanghai (CN); Peng Wang, Shanghai (CN); Zhenhua Ye, Shanghai (CN); Fansheng Chen, Shanghai (CN); Wei Lu, Shanghai (CN)

(73) Assignee: SHANGHAI INSTITUTE OF TECHNICAL PHYSICS CAS, Shanghai (CN)

( * ) Notice: Subject to any disclaimer, the term of this patent is extended or adjusted under 35 U.S.C. 154(b) by 315 days.

(21) Appl. No.: 18/735,464

(22) Filed: Jun. 6, 2024

(65) Prior Publication Data

US 2025/0380516 A1 Dec. 11, 2025

(51) Int. Cl.
*H10F 71/00* (2025.01)
*H10D 30/01* (2025.01)
(Continued)

(52) U.S. Cl.
CPC ....... *H10F 30/282* (2025.01); *H10F 30/2275* (2025.01); *H10F 71/00* (2025.01);
(Continued)

(58) Field of Classification Search
CPC ...... H10F 30/2877; H10F 71/00; H10F 77/12; H10F 77/206; H10F 30/227;
(Continued)

(56) References Cited

U.S. PATENT DOCUMENTS

2017/0018561 A1* 1/2017 Liang ...................... B29C 59/02
2022/0288576 A1* 9/2022 Li .......................... B01J 27/051
(Continued)

FOREIGN PATENT DOCUMENTS

CN 107221564 A * 9/2017 ............ H10D 30/67
CN 113948594 A * 1/2022 ............ H10F 71/00
(Continued)

OTHER PUBLICATIONS

Nam et al., MoS2 Transistors Fabricated via Plasma-Assisted Nanoprinting of Few-Layer-MoS2 Flakes into Large-Area Arrays, ACS Nano 2013, 7, 5870-5881 (Year: 2013).*

*Primary Examiner* — Earl N Taylor
(74) *Attorney, Agent, or Firm* — Myers Wolin, LLC

(57) ABSTRACT

Provided are a two-dimensional (2D) metal/semiconductor/metal (MSM) device with non-volatile and linearly tunable optical responsivity based on sulfur vacancy migration and a preparation method thereof. The 2D metal/semiconductor/metal (MSM) device with non-volatile and linearly tunable optical responsivity based on sulfur vacancy migration includes a device base, a source electrode, and a drain electrode; where the MSM device base includes a silicon/silica ($Si/SiO_2$) substrate and a molybdenum sulfide layer which are sequentially stacked; and the source electrode and the drain electrode are located on a surface of the molybdenum sulfide layer.

7 Claims, 7 Drawing Sheets

(51) Int. Cl.

| | |
|---|---|
| ***H10F 30/227*** | (2025.01) |
| ***H10F 30/282*** | (2025.01) |
| ***H10F 77/20*** | (2025.01) |
| *H10D 30/47* | (2025.01) |
| *H10D 62/80* | (2025.01) |

(52) U.S. Cl.
CPC ......... *H10F 77/206* (2025.01); *H10D 30/017* (2025.01); *H10D 30/481* (2025.01); *H10D 62/883* (2025.01)

(58) Field of Classification Search
CPC ... H01L 31/1129; H01L 31/18; H10D 30/017; H10D 30/481; H10D 62/881; H10D 62/883
See application file for complete search history.

(56) References Cited

U.S. PATENT DOCUMENTS

| | | | | |
|---|---|---|---|---|
| 2023/0207633 | A1 * | 6/2023 | Suto | G01N 27/4145 257/213 |
| 2024/0079234 | A1 * | 3/2024 | Ho | H10D 48/04 |
| 2024/0079477 | A1 * | 3/2024 | Zhou | H10D 30/6755 |
| 2024/0088240 | A1 * | 3/2024 | Chen | H10D 30/6729 |
| 2024/0145478 | A1 * | 5/2024 | Hsueh | H10D 30/015 |
| 2024/0321578 | A1 * | 9/2024 | Liu | H10D 30/675 |
| 2024/0321999 | A1 * | 9/2024 | Wang | G06N 3/06 |
| 2024/0373766 | A1 * | 11/2024 | Zhang | H10N 70/253 |
| 2025/0072159 | A1 * | 2/2025 | Yeh | G01R 33/1284 |
| 2025/0179684 | A1 * | 6/2025 | Zhang | B82Y 40/00 |
| 2025/0196048 | A1 * | 6/2025 | Fan | G01N 30/6052 |

FOREIGN PATENT DOCUMENTS

| | | | | | |
|---|---|---|---|---|---|
| CN | 110865113 | B | * | 3/2024 | G01N 27/4146 |
| CN | 118116956 | A | * | 5/2024 | H10D 30/60 |
| CN | 118116976 | A | * | 5/2024 | H10D 99/00 |

* cited by examiner

TWO-DIMENSIONAL METAL/SEMICONDUCTOR/METAL DEVICE WITH NON-VOLATILE AND LINEARLY TUNABLE OPTICAL RESPONSIVITY BASED ON SULFUR VACANCY MIGRATION, AND PREPARATION METHOD THEREOF

TECHNICAL FIELD

The present disclosure belongs to the technical field of intelligent detection, and in particular relates to a two-dimensional metal/semiconductor/metal (MSM) device with non-volatile and linearly tunable optical responsivity based on sulfur vacancy migration, and a preparation method thereof.

BACKGROUND

Intelligent vision systems have important applications in fields such as meteorological remote sensing and intelligent livelihood. Highly dynamic autonomous decision-making is a key link in the intelligent vision systems, and the core concept thereof focuses on the ability to quickly acquire information and efficiently process it. Two-dimensional (2D) materials have received widespread attention due to their excellent optical, electrical, and mechanical properties. Floating-gate devices, dual-gate control devices and ferroelectric control devices based on $WSe_2$, bP and $\alpha$-$In_2Se_3$ have been widely reported for use in the intelligent vision systems. However, the current device structures based on floating-gate, dual-gate, and ferroelectric control solutions are complex and difficult to achieve integration. However, gate-controlled devices require voltage to maintain the state of the device, making it difficult to meet the requirements of non-volatile optical responsivity. Meanwhile, a relatively lower thickness of the material affects light absorption efficiency of the material, and makes it difficult to meet high responsivity, great linearity, and non-volatile tunability requirements of the intelligent vision systems. Bulk materials are used in the research of the intelligent vision systems due to their stability and mature preparation processes. Two-terminal metal/semiconductor/metal (MSM) devices based on GaAs and InGaAs could modulate direction and width of the Schottky barrier region through bias voltage to achieve linearly tunable optical responsivity. However, power consumption caused by bias voltage is difficult to meet efficient intelligent visual recognition process.

$MoS_2$ has excellent photoelectric properties, with a migration rate of 200 $cm^2\ V^{-1}\ s^{-1}$ at room temperature. Under 561 nm of light illumination, two-terminal photoconductive device of $MoS_2$ has an optical responsivity of 880 $AW^{-1}$. However, the optical responsivity is not non-volatile and linearly tunable. Meanwhile, plasma etching could introduce sulfur vacancies into $MoS_2$, and the sulfur vacancies migrate under an electric field of 105 V/cm. After removing the electric field, the positions of the sulfur vacancies remain unchanged, exhibiting high stability.

SUMMARY

In view of this, objects of the present disclosure is to provide a two-dimensional (2D) metal/semiconductor/metal (MSM) device with non-volatile and linearly tunable optical responsivity based on sulfur vacancy migration and a preparation method thereof. In the present disclosure, the 2D metal/semiconductor/metal (MSM) device based on sulfur vacancy migration achieves good non-volatile linear tunable optical responsivity in visible light and near-infrared.

To achieve the above object, the present disclosure provides the following technical solutions.

The present disclosure provides a two-dimensional (2D) metal/semiconductor/metal (MSM) device based on sulfur vacancy migration, including a device base, a source electrode, and a drain electrode; where the 2D metal/semiconductor/metal (MSM) device base includes a silicon/silica ($Si/SiO_2$) substrate and a molybdenum sulfide layer which are sequentially stacked; and the source electrode and the drain electrode are located on a surface of the molybdenum sulfide layer.

In some embodiments, the molybdenum sulfide layer is composed of molybdenum sulfide nano-flakes, and each of the monolithic molybdenum sulfide nano-flakes has a flake diameter of 10 μm to 15 μm and a thickness of 10 nm to 50 nm.

In some embodiments, each of the source electrode and the drain electrode includes a Cr layer and an Au layer, and the Cr layer is in contact with the molybdenum sulfide layer.

In some embodiments, the $Si/SiO_2$ substrate has a thickness of 500 μm/285-305 nm;

the molybdenum sulfide layer has a thickness of 10 nm to 50 nm; and in the source electrode and the drain electrode, the Cr layer has a thickness of 1 nm to 3 nm and the Au layer has a thickness of 30 nm to 50 nm.

The present disclosure provides a method for preparing the 2D metal/semiconductor/metal (MSM) device based on sulfur vacancy migration described above, including the following steps:

(1) transferring the molybdenum sulfide nano-flakes onto the $Si/SiO_2$ substrate, and applying a photoresist onto the molybdenum sulfide nano-flakes to obtain a molybdenum sulfide layer covered with the photoresist on a surface of the $Si/SiO_2$ substrate;

(2) subjecting the photoresist to etching to obtain an exposed pattern, with an exposed source electrode window and an exposed drain electrode window on the surface of the molybdenum sulfide layer;

(3) subjecting the molybdenum sulfide layer with the exposed source electrode window and the exposed drain electrode window in step (2) to $O_2$ plasma etching and Ar plasma etching sequentially; and (4) performing evaporation deposition of metal on a surface of the molybdenum sulfide layer with the exposed source electrode window and the exposed drain electrode window after plasma etching, and stripping the photoresist to obtain the source electrode and drain electrode on the surface of the molybdenum sulfide layer, thereby obtaining the 2D metal/semiconductor/metal (MSM) device based on sulfur vacancy migration.

In some embodiments, in step (1), liquid polymethyl methacrylate (PMMA) is loaded onto the molybdenum sulfide layer by spin coating, and the spin coating is conducted at a rate of 4,000 rpm to 5,000 rpm for 50 s to 60 s.

In some embodiments, in step (3), the $O_2$ plasma etching is conducted for 10 s to 15 s, the Ar plasma etching is conducted for 30 s to 40 s, and the $O_2$ plasma etching and the Ar plasma etching each are conducted under a vacuum degree of $1\times10^{-7}$ Torr to $8\times10^{-7}$ Torr and at a gas flow rate of 25 sccm to 35 sccm.

In some embodiments, the evaporation deposition in step (4) is conducted at an independent temperature of 1,200° C.

to 1,500° C. and an independent speed of 0.1 Å to 0.5 Å; and the evaporation deposition is conducted under an independent vacuum degree of $6\times10^{-7}$ Torr to $1\times10^{-6}$ Torr.

In some embodiments, subjecting the photoresist to etching is performed by electron beam lithography; and stripping the photoresist is performed by immersing in acetone.

The present disclosure provides a two-dimensional (2D) metal/semiconductor/metal (MSM) device with non-volatile and linearly tunable optical responsivity based on sulfur vacancy migration, including a device base, a source electrode, and a drain electrode; where the metal/semiconductor/metal (MSM) device base based on sulfur vacancy migration includes a silicon/silica ($Si/SiO_2$) substrate and a molybdenum sulfide layer which are sequentially stacked; and the source electrode and the drain electrode are located on a surface of the molybdenum sulfide layer. In the present disclosure, by utilizing migration of sulfur vacancies in $MoS_2$ under an action of an electric field, the Schottky barrier at a metal/semiconductor interface is adjusted to achieve controllable non-volatile linear optical responsivity. The metal/semiconductor/metal (MSM) device based on the structure of the present disclosure has a maximum responsivity of 369.2 mA/W at room temperature in a visible light wave band (520 nm), achieving controllable 11 different optical responsivity states with a storage time of >1,000 s. In addition, the metal/semiconductor/metal (MSM) device provided by the present disclosure has good linearity and exhibits good optical responsivity linearity over a light intensity of 16 mW/cm$^2$ to 2,600 mW/cm$^2$. In the present disclosure, the process of adjusting positive and negative optical responsivity could also be observed when using $WS_2$ material in the device.

DETAILED DESCRIPTION OF THE EMBODIMENTS

Figure 1:
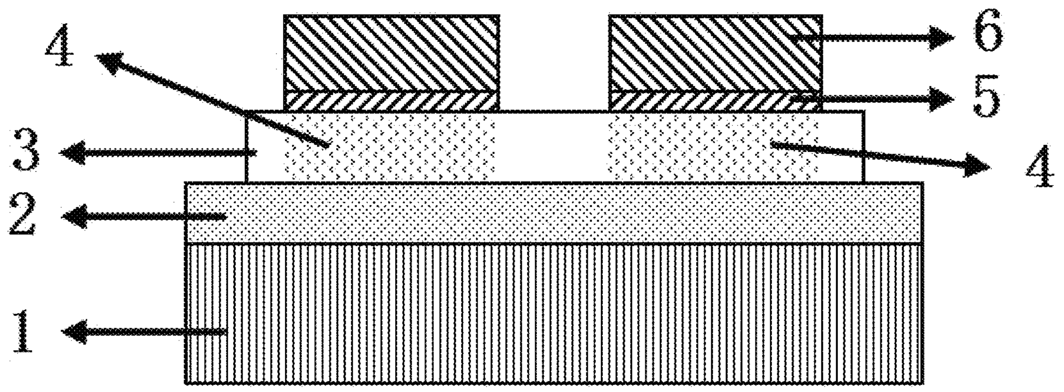
FIG. 1 shows a structural schematic diagram of the 2D metal/semiconductor/metal (MSM) device with non-volatile and linearly tunable optical responsivity based on sulfur vacancy migration.

The present disclosure provides a two-dimensional (2D) metal/semiconductor/metal (MSM) device with non-volatile and linearly tunable optical responsivity based on sulfur vacancy migration, including a device base, a source electrode, and a drain electrode; where the 2D metal/semiconductor/metal (MSM) device base includes a silicon/silica ($Si/SiO_2$) substrate and a molybdenum sulfide layer which are sequentially stacked; and the source electrode and the drain electrode are located on a surface of the molybdenum sulfide layer.

The metal/semiconductor/metal (MSM) device base based on sulfur vacancy migration includes a silicon/silica ($Si/SiO_2$) substrate and a molybdenum sulfide layer which are sequentially stacked. In some embodiments of the present disclosure, the $Si/SiO_2$ substrate has a thickness of 500 μm/285 nm to 305 nm, and preferably 500 μm/300 nm.

In some embodiments of the present disclosure, the molybdenum sulfide layer has a thickness of 10 nm to 50 nm, and preferably 15 nm to 25 nm. In the present disclosure, the molybdenum sulfide layer is composed of molybdenum sulfide nano-flakes. In some embodiments of the present disclosure, each of the monolithic molybdenum sulfide nano-flakes has a flake diameter of 10 μm to 15 μm and a thickness of 15 nm to 25 nm.

In some embodiments of the present disclosure, each of the source electrode and the drain electrode is made of Cr and Au. In some embodiments of the present disclosure, the source electrode has a thickness of 1 nm to 3 nm, and the drain electrode has a thickness of 30 nm to 50 nm. In some embodiments of the present disclosure, the source electrode and the drain electrode are located at two terminals of the molybdenum sulfide layer, respectively.

The present disclosure provides a method for preparing the 2D metal/semiconductor/metal (MSM) device based on sulfur vacancy migration described above, including the following steps:

(1) transferring the molybdenum sulfide nano-flakes onto the $Si/SiO_2$ substrate, and applying a photoresist onto the molybdenum sulfide nano-flakes to obtain a molybdenum sulfide layer covered with the photoresist on a surface of the $Si/SiO_2$ substrate;

(2) subjecting the photoresist to etching to obtain an exposed pattern, with an exposed source electrode window and an exposed drain electrode window on the surface of the molybdenum sulfide layer;

(3) subjecting the molybdenum sulfide layer with the exposed source electrode window and the exposed drain electrode window in step (2) to $O_2$ plasma etching and Ar plasma etching sequentially; and (4) performing evaporation deposition of metal on a surface of the molybdenum sulfide layer with the exposed source electrode window and the exposed drain electrode window, and stripping the photoresist, to obtain the source electrode and the drain electrode on the surface of the molybdenum sulfide layer, thereby obtaining the 2D metal/semiconductor/metal (MSM) device based on sulfur vacancy migration.

In the present disclosure, molybdenum sulfide nano-flakes are loaded on a surface of the $Si/SiO_2$ substrate, and a photoresist is applied onto the molybdenum sulfide nano-flakes, to obtain a molybdenum sulfide layer covered with the photoresist on the surface of the $Si/SiO_2$ substrate. In some embodiments of the present disclosure, the molybdenum sulfide nano-flakes are obtained by mechanical exfoliation. In some embodiments of the present disclosure, the mechanical exfoliation includes the following steps: placing a molybdenum sulfide bulk material flake on an adhesive tape, and repeatedly folding and sticking to obtain the molybdenum sulfide nano-flakes on a surface of the adhesive tape. In some embodiments of the present disclosure, the adhesive tape is a blue transparent adhesive tape. In some embodiments of the present disclosure, the method further includes transferring the molybdenum sulfide nano-flakes onto the surface of the $Si/SiO_2$ substrate by a adhesive tape.

In some embodiments of the present disclosure, the photoresist is polymethyl methacrylate (PMMA). In some embodiments of the present disclosure, the photoresist is applied by spin coating. In some embodiments of the present disclosure, the spin coating is conducted at a rate of 4,000 r/min to 5,000 r/min, and preferably 4,500 r/min. In some embodiments of the present disclosure, after the photoresist is applied, a resulting system is subjected to heat curing. In some embodiments of the present disclosure, the heat curing is conducted at a temperature of 130° C. to 180° C., and preferably 140° C. to 160° C. In some embodiments of the present disclosure, the heat curing is conducted for 5 min to 8 min, and preferably 6 min to 7 min.

In the present disclosure, the photoresist is subjected to etching to expose a source electrode window and a drain electrode window on a surface of the molybdenum sulfide layer, and the evaporation deposition is performed on a surface of the photoresist and exposed windows to form the source electrode and the drain electrode. In some embodiments of the present disclosure, the etching of the photoresist is conducted by electron beam lithography.

In some embodiments of the present disclosure, $MoS_2$ material of the source electrode window and the drain electrode window is subjected to plasma etching, preferably $O_2$ plasma etching and Ar plasma etching sequentially. In some embodiments of the present disclosure, the $O_2$ plasma etching is conducted for 10 s to 20 s, and preferably 15 s. In some embodiments of the present disclosure, the Ar plasma etching is conducted for 30 s to 50 s, and preferably 40 s. In some embodiments of the present disclosure, the $O_2$ plasma etching and the Ar plasma etching each are conducted under a vacuum degree of $1\times10^{-7}$ Torr to $8\times10^{-7}$ Torr, and preferably $1\times10^{-7}$ Torr to $2\times10^{-7}$ Torr. In some embodiments of the present disclosure, the $O_2$ plasma etching and the Ar plasma etching each are conducted at a gas ($O_2$/Ar) flow rate of 25 sccm to 40 sccm, and preferably 30 sccm to 35 sccm.

In some embodiments of the present disclosure, a metal for the vacuum evaporation are Cr and Au. In some embodiments of the present disclosure, the evaporation deposition is conducted at a temperature of 1,200° C. to 1,500° C., and preferably 1,300° C. to 1,400° C. In some embodiments of the present disclosure, the evaporation deposition is conducted at a speed of 0.1 Å to 0.5 Å, and preferably 0.3 Å to 0.4 Å. In some embodiments of the present disclosure, the evaporation deposition is conducted under a vacuum degree of $6\times10^{-7}$ Torr to $1\times10^{-6}$ Torr, and preferably $8\times10^{-7}$ Torr to $9\times10^{-7}$ Torr.

In some embodiments of the present disclosure, the photoresist is stripped by immersing in acetone. In some embodiments of the present disclosure, the immersing is conducted for 30 min to 60 min, and preferably 40 min to 50 min.

In the present disclosure, the photoresist is stripped to obtain the two-dimensional (2D) metal/semiconductor/metal (MSM) device based on sulfur vacancy migration.

Figure 2:
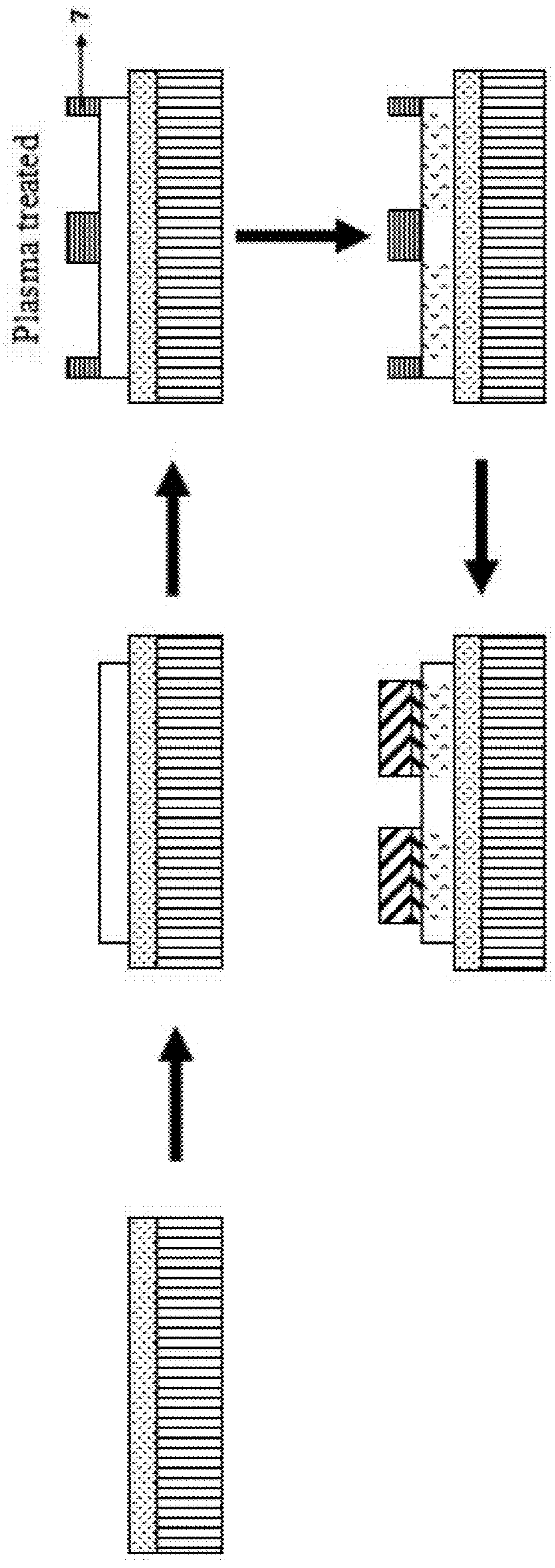
FIG. 2 shows a schematic flow chart for preparation of the 2D metal/semiconductor/metal (MSM) device with non-volatile and linearly tunable optical responsivity based on sulfur vacancy migration.

In the present disclosure, FIG. 1 shows a structural schematic diagram of the 2D metal/semiconductor/metal (MSM) device based on sulfur vacancy migration, and a schematic flow chart for preparation thereof is shown in FIG. 2. In FIG. 1, 1 refers to p-type heavily doped silicon, 2 refers to a silica layer, 3 refers to a molybdenum sulfide layer, 4 refers to a treated molybdenum sulfide layer, 5 refers to a chromium (Cr) metal electrode, and 6 refers to a gold (Au) metal electrode. In FIG. 2, 7 refers to polymethyl methacrylate (PMMA) photoresist.

The 2D metal/semiconductor/metal (MSM) device based on sulfur vacancy migration and preparation method thereof according to the present disclosure will be described in detail in conjunction with examples below, but these examples could not be understood as limiting the scope of the present disclosure.

Example 1

A method for preparing a two-dimensional (2D) metal/semiconductor/metal (MSM) device based on sulfur vacancy migration was performed as follows:

A molybdenum sulfide bulk material was exfoliated into layered molybdenum sulfide flakes by mechanical exfoliation. The molybdenum sulfide flakes were soaked in a hot acetone solution for 1 h to remove tape residue on a surface thereof. The molybdenum sulfide flakes were transferred onto a silicon/silica substrate. A PMMA solution was applied onto a surface thereof through spin coating at a rotating speed of 5000 r/min, and then baked at a temperature of 150° C. for 5 min to obtain a photoresist layer. Electron beam lithography (EBL) was used to locate a source electrode window and a drain electrode window. $O_2$ plasma etching and Ar plasma etching were sequentially conducted for 10 s and 30 s, respectively, under a vacuum degree of $2\times10^{-7}$ Torr and at a gas flow rate of 30 sccm. Evaporation deposition was performed under a vacuum degree of $6\times10^{-7}$ Torr and at a temperature of 1,500° C., to obtain a 1 nm Cr film and a 45 nm Au film.

The photoresist was stripped in an acetone solution to form a source metal electrode and a drain metal electrode, thereby obtaining the 2D metal/semiconductor/metal (MSM) device based on sulfur vacancy migration.

Figure 3:
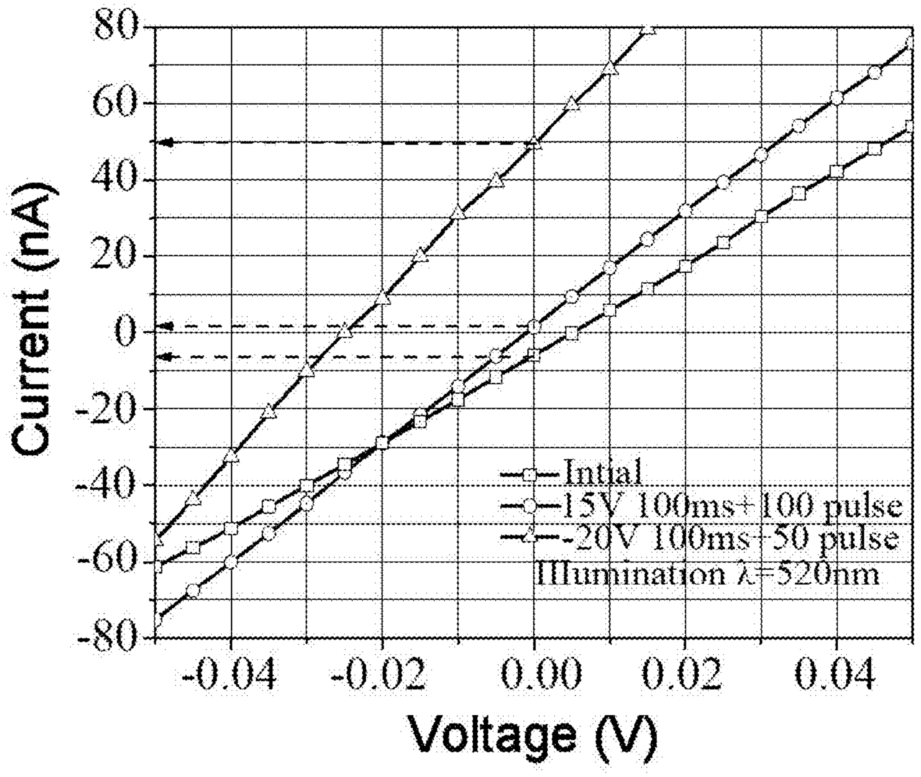
FIG. 3 shows output characteristic curves of the MSM device obtained in Example 1 under illumination after applying different-voltage pulses.

Output characteristic curves of the MSM device obtained in Example 1 under illumination after applying different-voltage pulses are shown in FIG. 3. As shown in FIG. 3, under illumination of 520 nm visible light, a short-circuit current of the device changes from −6 nA to 1.5 nA after applying 100 voltage pulses with a voltage of −15 V and a duration of 100 ms. Immediately after applying 50 voltage pulses with a voltage of −20 V and a duration of 100 ms, the short-circuit current of the device changes from 1.5 nA to 50 nA. Under an action of the pulse voltage, sulfur vacancies caused by plasma treatment migrate, which affects the changes of Schottky barrier between the metal and the semiconductor at the electrode position and produces asymmetric barrier, thereby adjusting change in the short-circuit current of the device under a condition of zero bias.

Figure 4:
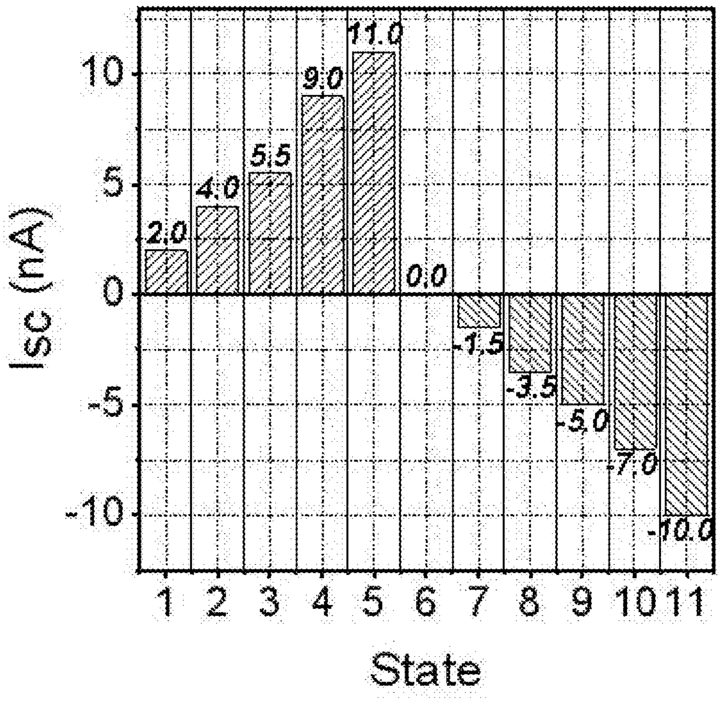
FIG. 4 shows a histogram of short-circuit current change of the MSM device obtained in Example 1 after applying voltage pulse.

A histogram of short-circuit current change of the MSM device obtained in Example 1 after applying voltage pulse is shown in FIG. 4. As shown in FIG. 4, under control of the voltage pulse, the short-circuit current of the device appears 5 positive and 5 negative and 0 states, totaling 11 different states, indicating that the device has excellent short-circuit current control ability.

Figure 5:
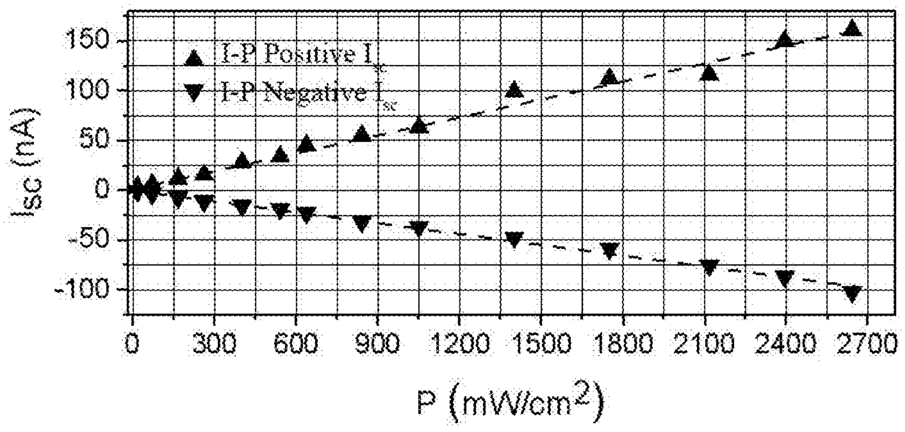
FIG. 5 shows a linear relationship curve between short-circuit current and optical power of the MSM device obtained in Example 1 under illumination.

Change curves of the short-circuit current of the MSM device obtained in Example 1 under different optical powers are shown in FIG. 5. As shown in FIG. 5, the short-circuit current of the device shows good linearity over an optical power of 16 $mW/cm^2$ to 2600 $mW/cm^2$.

Figure 6:
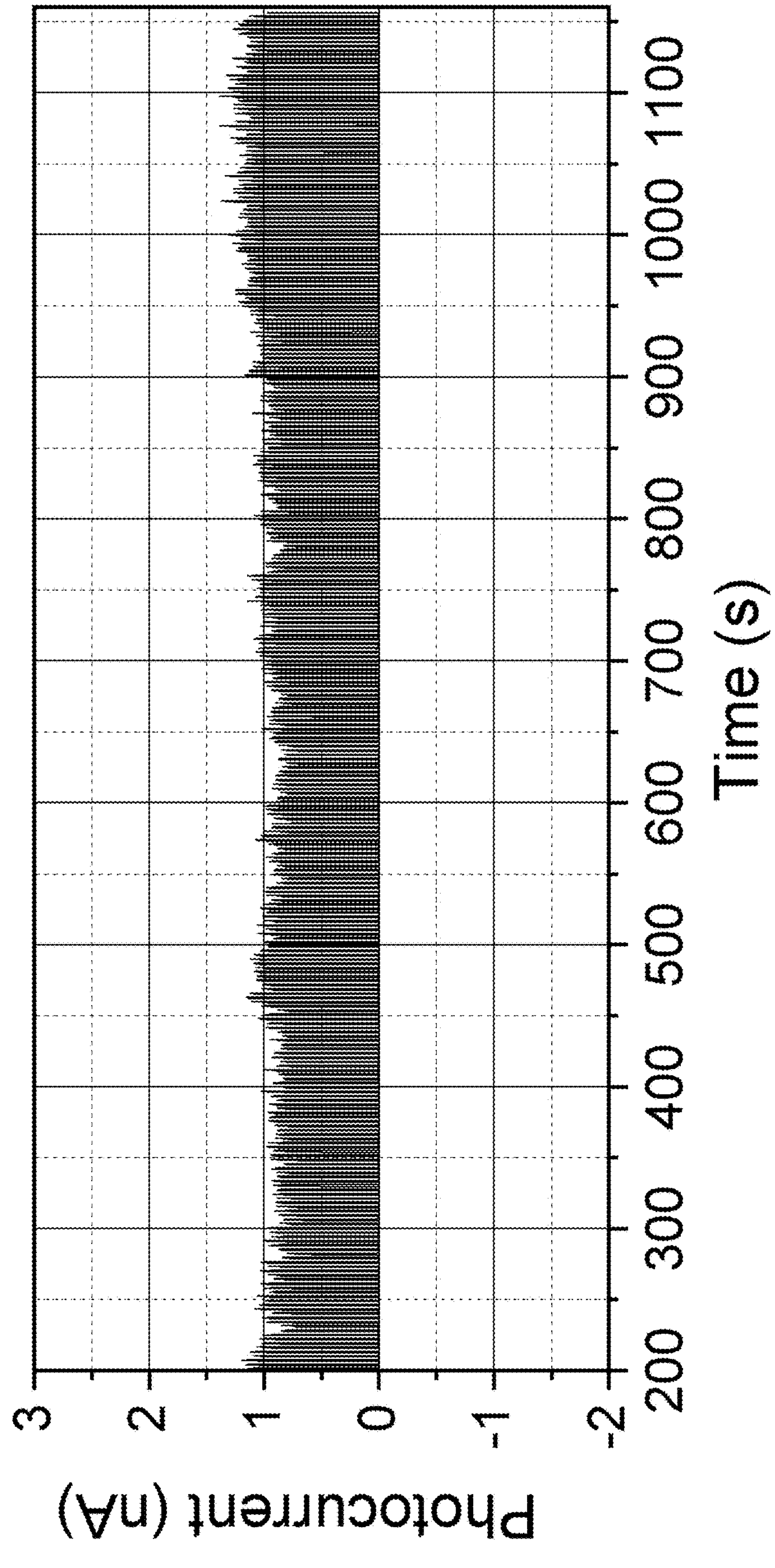
FIG. 6 shows a photocurrent duration curve of the MSM device obtained in Example 1 under illumination without applying bias voltage.

A photocurrent duration curve of the MSM device obtained in Example 1 without applying bias voltage and under illumination is shown in FIG. 6. As shown in FIG. 6, the short-circuit current of the device is basically kept in a stable state within 1000 s, and the photocurrent has a good storage capacity, indicating non-volatile characteristics of the photocurrent of the device.

Comparative Example 1

A metal/semiconductor/metal (MSM) device based on pristine $MoS_2$ was prepared. The specific operations were the same as that in Example 1, except that materials at the source electrode and the drain electrode were not treated with $O_2$ plasma and Ar plasma.

Figure 7:
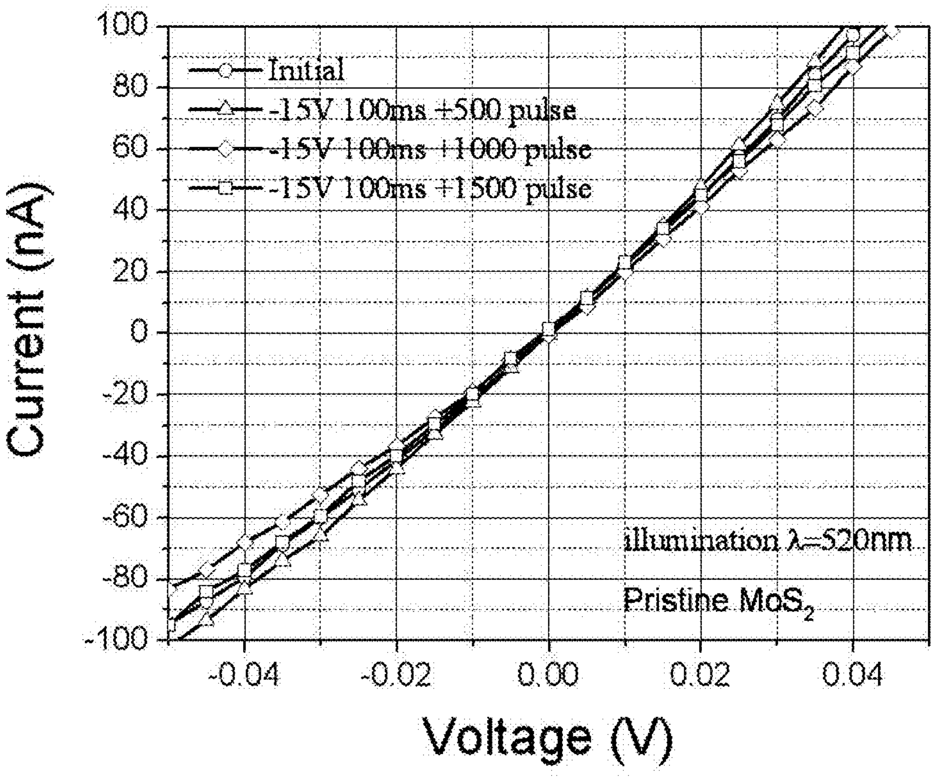
FIG. 7 shows output characteristic curves of the untreated MSM device obtained in Comparative Example 1 after applying different-voltage pulses.

A photocurrent testing was conducted on the molybdenum sulfide ($MoS_2$) MSM device obtained in Comparative Example 1. Under an action of a voltage pulse with a voltage of −15 V and a duration of 100 ms, 500, 1000 and 1500 voltage pulses were applied, and the short-circuit current of the device does not change significantly compared with that of the initial state device, as shown in FIG. 7. The results show that there is no regulation phenomenon of the short-circuit current, and the regulation ability of light short-circuit current is significantly weaker than that of the molybdenum sulfide metal/semiconductor/metal (MSM) based on sulfur vacancy migration obtained in Example 1 under illumination conditions.

Comparative Example 2

A $WS_2$ metal/semiconductor/metal (MSM) device based on sulfur vacancy migration was prepared. The specific operations were the same as that in Example 1, except that the $MoS_2$ was replaced by $WS_2$.

Figure 8A:
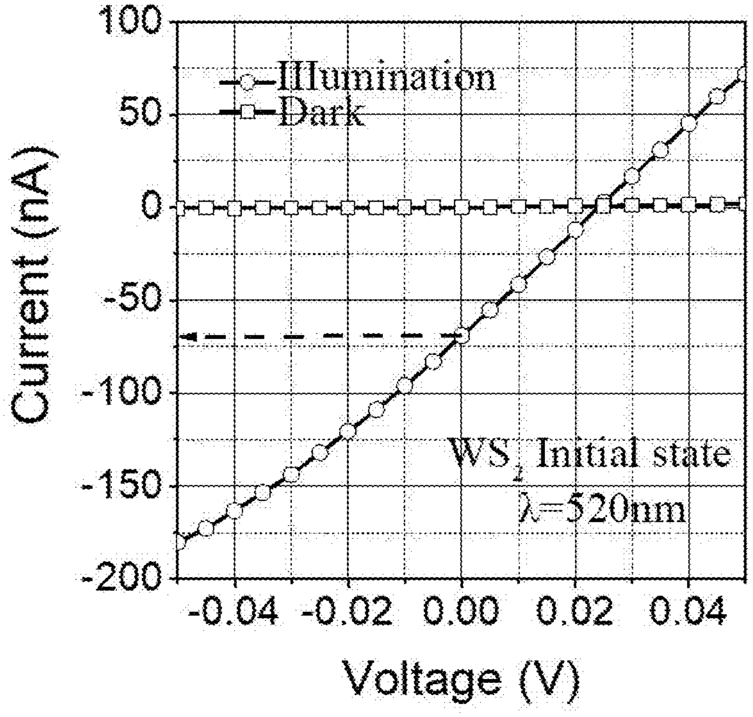
FIGS. 8A-8B show output characteristic curves of the MSM device of $WS_2$ obtained in Comparative Example 2 in initial state and after applying voltage pulse.
Figure 8B:
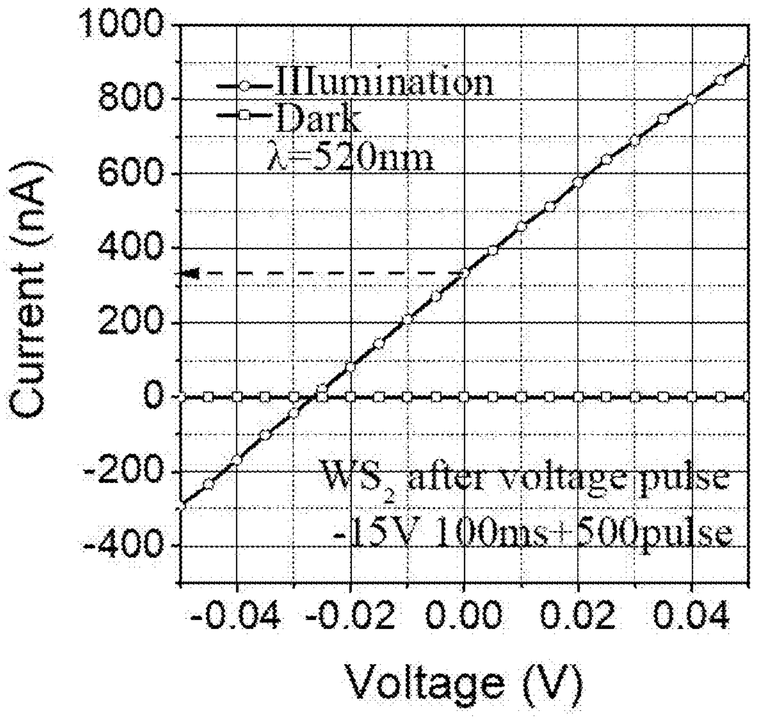

A photocurrent testing was conducted on the tungsten sulfide ($WS_2$) MSM device obtained in Comparative Example 2. In the initial state, the device showed a short-circuit current of −70 nA. After applying 500 voltage pulses with a voltage of −15 V and a duration of 100 ms, the short-circuit current of the device became 330 nA, indicating the short-circuit current regulation ability of the device after the voltage was applied, as shown in FIGS. 8A-8B.

The above descriptions are merely preferred embodiments of the present disclosure. It should be noted that a person of ordinary skill in the art may further make several improvements and modifications without departing from the principle of the present disclosure, but such improvements and modifications should be deemed as falling within the protection scope of the present disclosure.

What is claimed is:

1. A method for preparing a two-dimensional (2D) metal/semiconductor/metal (MSM) device with non-volatile and linearly tunable optical responsivity based on sulfur vacancy migration, wherein the 2D MSM device with non-volatile and linearly tunable optical responsivity based on sulfur vacancy migration comprises a device base, a source electrode, and a drain electrode, the device base comprising a silicon/silica ($Si/SiO_2$) substrate and a molybdenum sulfide layer which are sequentially stacked, and the source electrode and the drain electrode being located on a surface of the molybdenum sulfide layer, the method comprising the following steps:

(1) transferring molybdenum sulfide nano-flakes onto the $Si/SiO_2$ substrate, and applying a photoresist onto the molybdenum sulfide nano-flakes to obtain the molybdenum sulfide layer covered with the photoresist on a surface of the $Si/SiO_2$ substrate;

(2) subjecting the photoresist to etching to obtain an exposed pattern, with an exposed source electrode window and an exposed drain electrode window on a surface of the molybdenum sulfide layer;

(3) subjecting the molybdenum sulfide layer with the exposed source electrode window and the exposed drain electrode window in step (2) to $O_2$ plasma etching and Ar plasma etching sequentially; and (4) performing evaporation deposition of metal on a surface of the molybdenum sulfide layer with the exposed source electrode window and the exposed drain electrode window after plasma etching, and stripping the photoresist, to obtain the source electrode and the drain electrode on the surface of the molybdenum sulfide layer, thereby obtaining the 2D metal/semiconductor/metal (MSM) device based on sulfur vacancy migration.

2. The method of claim 1, wherein in step (3), the $O_2$ plasma etching is conducted for 10 s to 15 s, the Ar plasma etching is conducted for 30 s to 40 s, and the $O_2$ plasma etching and the Ar plasma etching each are conducted under a vacuum degree of $1\times10^{-7}$ Torr to $8\times10^{-7}$ Torr and at a gas flow rate of 25 sccm to 35 sccm.

3. The method of claim 1, wherein the evaporation deposition in step (4) is conducted at an independent temperature of 1,200° C. to 1,500° C. and an independent speed of 0.1 Å to 0.5 Å; and the evaporation deposition is conducted under an independent vacuum degree of $6\times10^{-7}$ Torr to $1\times10^{-6}$ Torr.

4. The method of claim 1, wherein subjecting the photoresist to etching is performed by electron beam lithography; and stripping the photoresist is performed by immersing in acetone.

5. The method of claim 1, wherein the molybdenum sulfide layer is composed of molybdenum sulfide nano-flakes, and each of the molybdenum sulfide nano-flakes has a flake diameter of 10 μm to 15 μm and a thickness of 10 nm to 50 nm.

6. The method of claim 1, wherein each of the source electrode and the drain electrode is made of Cr and Au.

7. The method of claim 1, wherein the $Si/SiO_2$ substrate has a thickness of 500 μm/285 nm to 305 nm;

the molybdenum sulfide layer has a thickness of 10 nm to 50 nm; and each of the source electrode and the drain electrode is made of Cr and Au, the source electrode has a thickness of 1 nm to 3 nm, and the drain electrode has a thickness of 30 nm to 50 nm.

* * * * *